(12) United States Patent
Chen et al.

(10) Patent No.: US 7,544,545 B2
(45) Date of Patent: Jun. 9, 2009

(54) TRENCH POLYSILICON DIODE

(75) Inventors: Qufei Chen, San Jose, CA (US); Robert Xu, Fremont, CA (US); Kyle Terrill, Santa Clara, CA (US); Deva Pattanayak, Saratoga, CA (US)

(73) Assignee: Vishay-Siliconix, Santa Clara, CA (US)

( * ) Notice: Subject to any disclaimer, the term of this patent is extended or adjusted under 35 U.S.C. 154(b) by 258 days.

(21) Appl. No.: 11/322,040

(22) Filed: Dec. 28, 2005

(65) Prior Publication Data
US 2007/0145411 A1    Jun. 28, 2007

(51) Int. Cl.
*H01L 21/20*    (2006.01)
(52) U.S. Cl. ........................ 438/141; 438/197; 438/212; 438/268; 438/270; 438/272; 257/E21.355; 257/E21.356; 257/E21.357; 257/E21.358
(58) Field of Classification Search ................. 438/141, 438/983, 197, 206, 270, 212, 268, 272; 257/E21.355, 257/E21.356, E21.357, E21.358
See application file for complete search history.

(56) References Cited

U.S. PATENT DOCUMENTS

| | | | |
|---|---|---|---|
| 5,321,289 A | 6/1994 | Baba et al. | |
| 5,502,320 A | 3/1996 | Yamada | |
| 5,637,898 A | 6/1997 | Baliga | |
| 5,661,322 A | 8/1997 | Williams et al. | |
| 5,998,833 A | 12/1999 | Baliga | |
| 5,998,836 A | 12/1999 | Williams | |
| 5,998,837 A | 12/1999 | Williams | |
| 6,046,470 A | 4/2000 | Williams et al. | |
| 6,049,108 A * | 4/2000 | Williams et al. | 257/341 |
| 6,078,090 A | 6/2000 | Williams et al. | |
| 6,140,678 A | 10/2000 | Grabowski et al. | |
| 6,255,683 B1 | 7/2001 | Radens et al. | |
| 6,365,462 B2 | 4/2002 | Baliga | |
| 6,548,860 B1 | 4/2003 | Hshieh et al. | |
| 6,855,593 B2 | 2/2005 | Andoh et al. | |
| 2004/0075145 A1 * | 4/2004 | Shibib | 257/355 |

\* cited by examiner

*Primary Examiner*—Long K Tran

(57) ABSTRACT

Embodiments of the present invention include a method of manufacturing a trench polysilicon diode. The method includes forming a N-(P-) type epitaxial region on a N+(P+) type substrate and forming a trench in the N-(P-) type epitaxial region. The method further includes forming a insulating layer in the trench and filling the trench with polysilicon forming a top surface of the trench. The method further includes forming P+(N+) type doped polysilicon region and N+(P+) type doped polysilicon region in the trench and forming a diode in the trench wherein a portion of the diode is lower than the top surface of the trench.

20 Claims, 21 Drawing Sheets

400

```
┌─────────────────────────────────────────────────┐
│  FORMING A TRENCH IN THE N⁻(P⁻) EPITAXIAL LAYER │
│                      402                        │
└─────────────────────────────────────────────────┘
                        │
                        ▼
┌─────────────────────────────────────────────────┐
│  FORMING A TRENCH AND GROWING LOCOS OXIDE IN THE│
│                     TRENCH                      │
│                      404                        │
└─────────────────────────────────────────────────┘
                        │
                        ▼
┌─────────────────────────────────────────────────┐
│   DEPOSITING POLYSILICON AND ETCHING BACK POLYSILICON│
│                      406                        │
└─────────────────────────────────────────────────┘
                        │
                        ▼
┌─────────────────────────────────────────────────┐
│ FORMING P⁺(N⁺) POLYSILICON REGION BY DOING P⁺(N⁺) ESD│
│                     IMPLANT                     │
│                      408                        │
└─────────────────────────────────────────────────┘
                        │
                        ▼
┌─────────────────────────────────────────────────┐
│ FORMING N⁺(P⁺) POLYSILICON REGION BY DOING N⁺(P⁺)│
│                  SOURCE IMPLANT                 │
│                      410                        │
└─────────────────────────────────────────────────┘
                        │
                        ▼
┌─────────────────────────────────────────────────┐
│   FORMING A DIODE IN THE TRENCH POLYSILICON REGION│
│  WHEREIN A PORTION OF DIODE IS LOWER THAN THE TOP│
│                SURFACE OF THE TRENCH            │
│                      412                        │
└─────────────────────────────────────────────────┘
```

FIGURE 4

TRENCH POLYSILICON DIODE

FIELD OF THE INVENTION

Metal oxide semiconductor (MOS) integrated circuits (ICs) and discrete power MOS transistors receive input signals through the gate of a MOS transistor. If a high voltage input signal is applied to the gate terminal, the gate oxide layer may be unable to withstand the high voltage and break down. When semiconductor devices are transported by humans or machines, higher than normal input voltages may be produced resulting in damage to the device.

However, the causes of abnormally high voltages are many. For example, electric charges can be produced by friction between surfaces or when an IC or a discrete MOS transistor is unpacked from plastic packaging. Static electricity can range from several hundreds volts to several thousand volts. If such high voltages are applied to the pins of an IC or discrete package, voltage breakdown of the gate oxide layer of a transistor within the package can occur which would result in the transistor being inoperative. As a result, the entire IC or a discrete MOS transistor could be rendered inoperative.

To prevent such damages to the MOS transistors, protective circuits are connected to pins of an IC or a discrete MOS transistor package. Such protective circuits are typically connected between each input/output (I/O) pad and the integrated circuit. The protective circuits are designed to conduct when a high voltage is applied to the I/O pad. Hence, these protective circuits provide an electrical path to, e.g., ground, to safely discharge the high spike current caused by high spike voltage and protect a MOS transistor from the damage of the gate oxide.

A surface-formed polysilicon Zener diode is preferred for ESD (electro-static discharge) protection in power trench MOS transistors. However, as feature sizes of semiconductor IC and devices are reduced, it is important to have flat surfaces for lithography module to print small features and therefore achieve higher cell density. A conventional surface-formed polysilicon Zener diode increases surface topology, which limits the ability to print small features during lithography.

SUMMARY OF THE INVENTION

Embodiments of the present invention include a method of manufacturing a trench polysilicon diode. The method includes forming a $N^-$ ($P^-$) type epitaxial layer which is depended on the drain-source breakdown voltage requirement of N-channel (P-channel) trench MOSFET on $N^+$ ($P^+$) type substrate, forming a trench in the $N^-$ ($P^-$) type epitaxial region and growing an thick oxide insulating layer lines the trench. The method further includes filling the trench with polysilicon and etching back polysilicon forming a top surface of the trench and forming a diode in the trench polysilicon region wherein a portion of the diode is lower than the top surface of the trench.

Embodiments of the present invention further include a trench MOSFET comprising electrostatic discharge protection. The trench MOSFET comprising a $N^-$ ($P^-$) type epitaxial region which is depended on the drain-source breakdown voltage requirement of N-channel (P-channel) trench MOSFET on $N^+$ ($P^+$) type substrate. A trench is formed in the $N^-$ ($P^-$) type epitaxial region, wherein the trench comprises a top surface. An gate oxide layer is grown on the trench and a gate polysilicon is deposited and etched back to form the gate of the trench MOSFET. The trench MOSFET further comprises a P(N) type body formed in the $N^-$ ($P^-$) type epitaxial region and $N^+$ ($P^+$) type source formed in the P(N) type body.

The trench polysilicon diode of the present invention significantly reduces the topology of the silicon surface by locating the polysilicon Zener diode structure in the silicon. Conventional polysilicon Zener diode structures are located on the surface of the silicon and increase the topology of the silicon, limiting feature size of lithography and reducing cell density. In one embodiment of the invention, modifying the stripe source block can specify different breakdown voltages of the polysilicon Zener diode structure. In one embodiment of the invention, paralleling more trench polysilicon Zener diode cells can specify different ESD rating. In one embodiment of the invention, the trench polysilicon diode can be also used for protection, clamping and temperature sensing functions.

BRIEF DESCRIPTION OF THE FIGURES

The accompanying drawings, which are incorporated in and form a part of this specification, illustrate embodiments of the present invention and, together with the description, serve to explain the principles of the invention:

FIGS. 1A, 1B, 1C, 1D, 1E, 1F, 1G, 1h, 1I, 1J, 1K, and 1L are illustrations of various steps performed during exemplary method of manufacturing a trench MOSFET comprising a trench polysilicon diode in accordance with embodiments of the present invention.

FIG. 4 is a process flow chart of an exemplary method for manufacturing a trench polysilicon diode in accordance with embodiments of the present invention.

DETAILED DESCRIPTION OF THE INVENTION

Reference will now be made in detail to the various embodiments of the present invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be understood that the present invention may be practiced without these specific details. In other instances, well-known methods, procedures, components, and circuits have not been described in detail so as not to unnecessarily obscure aspects of the present invention.

Embodiments of the present invention include a method and structure of a trench polysilicon diode. The trench polysilicon diode of the present invention significantly reduces the topology of the silicon surface by locating the trench polysilicon diode structure in the silicon. Conventional polysilicon diode structures are located on the surface of the silicon and increase the topology of the silicon, reducing cell density. In one embodiment of the invention, modifying the diode implantations can specify different break down voltages of the trench polysilicon Zener diode structure. In one embodiment of the invention, modifying the series back-to-back diode numbers can also specify different breakdown voltages of the trench polysilicon Zener diode structure. In one embodiment of the invention, a trench polysilicon Zener diode is formed for ESD protection. In one embodiment of the invention, the trench polysilicon Zener diode cells can be paralleled for specifying an ESD rating. In one embodiment of the invention, the trench polysilicon diode can be used for temperature sensing. In one embodiment of the invention1 a trench polysilicon Zener diode can be used for the source-drain over-voltage protection and clamping function.

FIGS. 1A, 1B, 1C, 1D 1E, 1F, 1G, 1H, 1I, 1J, 1K, and 1L are illustrations of various steps performed during exemplary methods of manufacturing a vertical trench polysilicon diode in accordance with embodiments of the present invention.

Figure 1A:
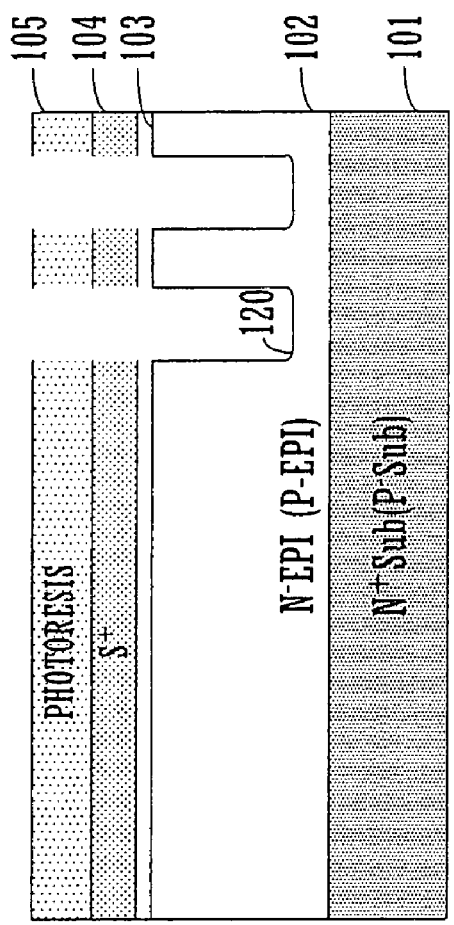

In FIG. 1A, an N−(P−) type doped epitaxial region 102 is formed over a conventionally N+(P+) type doped substrate 101. An oxide pad 103 is formed over the N−(P−) type doped epitaxial region 102. In one embodiment of the invention, the oxide pad is approximately 300 angstroms in thickness. In one embodiment of the invention, the oxide pad comprises $SiO_2$. A silicon nitride layer 104 is formed over the oxide pad 103. In one embodiment of the invention, silicon nitride layer 104 is approximately two thousand angstroms in thickness.

A photoresist layer 105 is used to mask the location of a trench 120. FIG. 1A is an illustration of the semiconductor device after the trench formation. In one embodiment of the invention, the trench 120 is an electrostatic discharge (ESD) trench. In another embodiment of the invention, the trench 120 is part of a trench diode used for a clamping function or for a temperature sensing function.

Figure 1B:
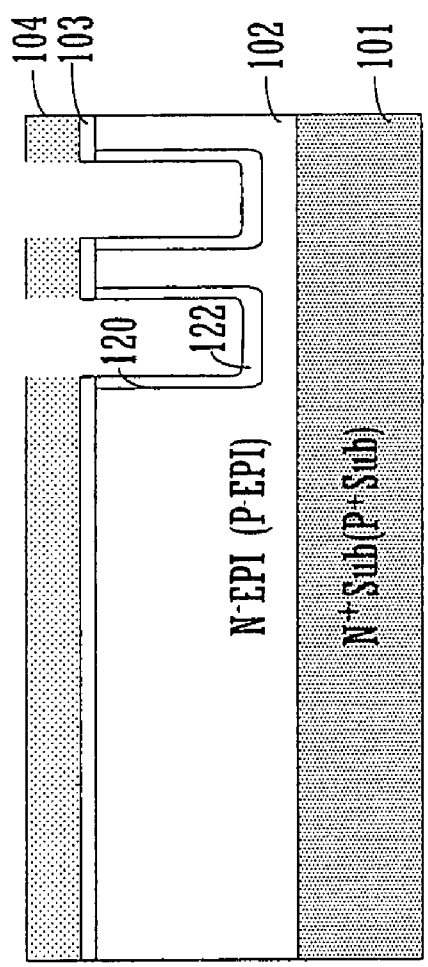

In FIG. 1B, the photoresist layer 105 (of FIG. 1A) is removed and an insulating layer 122 is formed on the inside of the trench 120. In one embodiment of the invention, the insulating layer comprises an LOCOS (localized oxidation of silicon) oxide. In one embodiment of the invention, the insulating layer is three thousand angstroms in thickness. In one embodiment of the invention, the thickness of the insulating layer 122 depends on the desired drain-source breakdown rating of the protected device for good isolation between the Zener diode and the protected device. For example, a thicker insulating layer 122 will provide a higher isolation rating than a thinner insulating layer 122. In one embodiment of the invention, an insulating layer 122 of three thousand angstroms comprises a breakdown voltage (BV) greater than 40 volts. In one embodiment of the invention, the insulating layer 122 is not formed on the top surface of the silicon nitride layer 104.

Figure 1C:
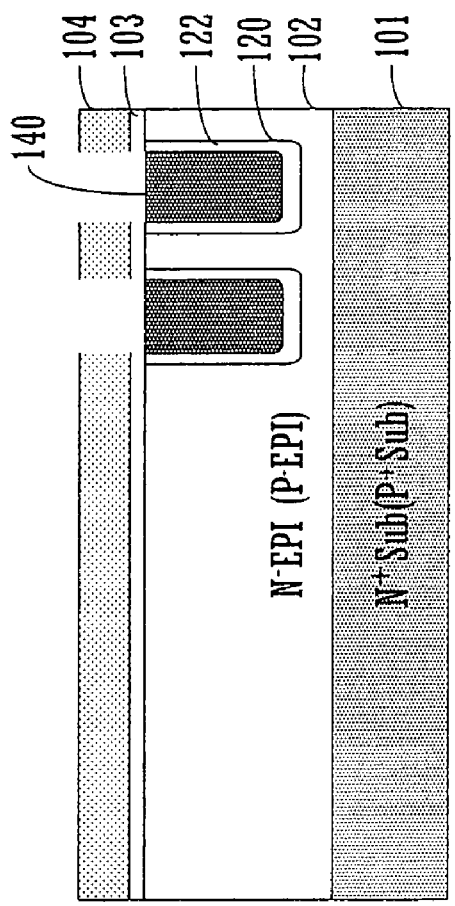

In FIG. 1C, a polysilicon layer 140 is deposited to fill the trench 120. In one embodiment of the invention, the polysilicon layer 140 is 1.5 micrometers thick and its thickness can be changed according to the trench width. The polysilicon layer 140 is deposited over the insulating layer 122. In one embodiment of the invention, the polysilicon layer is deposited over the surface of silicon nitride layer 104. In this embodiment of the invention, the silicon nitride layer 104 serves as an etch stop. FIG. 1C is an illustration after etchback of the polysilicon layer 140. The remaining polysilicon 140 fills the trench 120. In one embodiment of the invention the trench is filled such that the top of the trench is level with the top layer of the N−(P−) type epitaxial region.

Figure 1D:
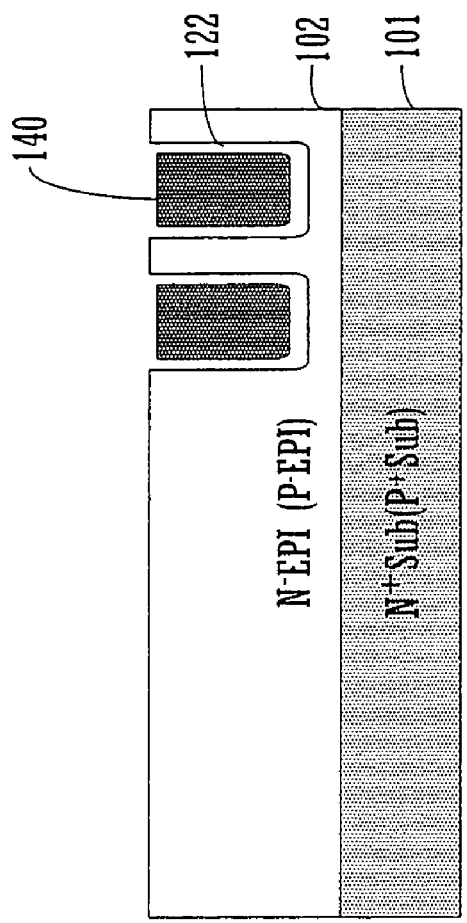
Figure 1E:
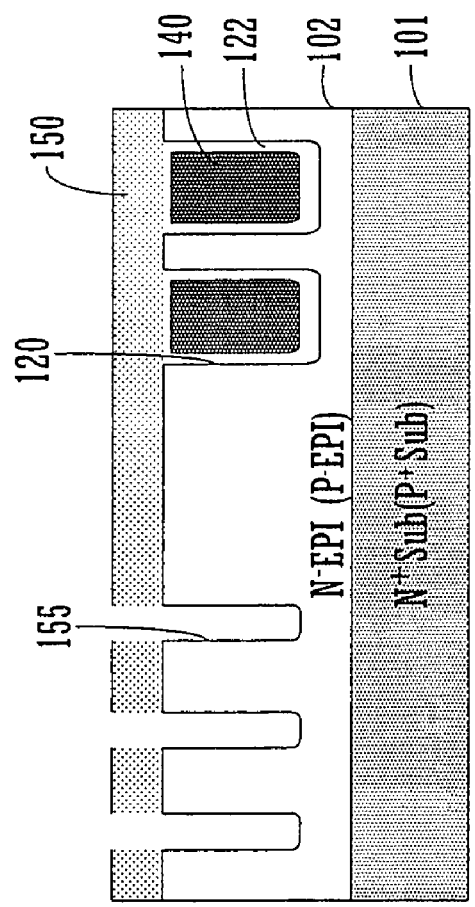

In FIG. 1D, the silicon nitride layer 104 and the oxide pad layer 103 are removed. In one embodiment of the invention, a buffer oxide etch or an HF etch are used to remove the oxide pad layer 103.

in FIG. IE, one or more MOSFET transistor trenches 155 are formed adjacent to the diode (ESD) trenches 120. A trench mask (photoresist) 150 masks the location for the MOSFET transistor trenches 155. In one embodiment of the invention, a conventional manufacture process is used to form the MOSFET trenches 155.

Figure 1F:
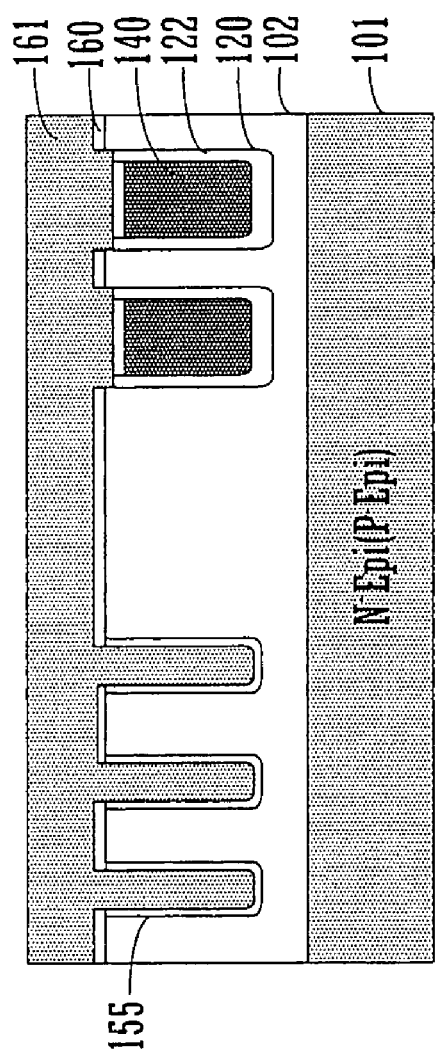

In FIG. 1F, the photoresist 150 is removed and a gate oxide layer 160 is formed and lines the MOSFET trenches 155. The gate oxide layer 160 is also formed on the top of the polysilicon 140 that fills the diode (ESD) trenches 120. A gate polysilicon layer 161 is deposited over the gate oxide layer 160. In one embodiment of the invention, the gate polysilicon 161 is approximately one micrometer in thickness. In one embodiment of the invention, gate doping can be performed at this step.

Figure 1G:
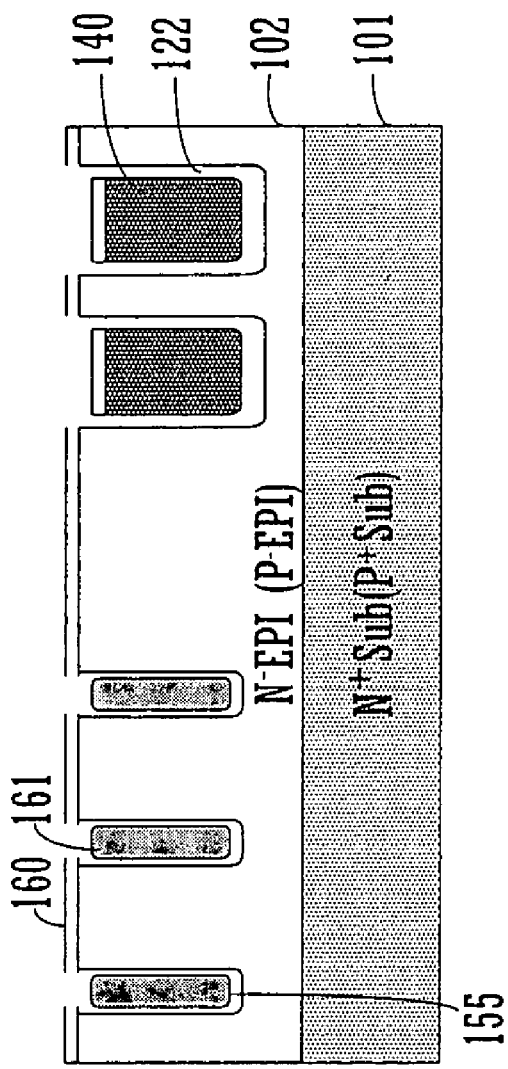

In FIG. 1G, the gate polysilicon 161 is etched back and a remaining portion of the gate polysilicon 161 fills the MOSFET trench 155.

Figure 1H:
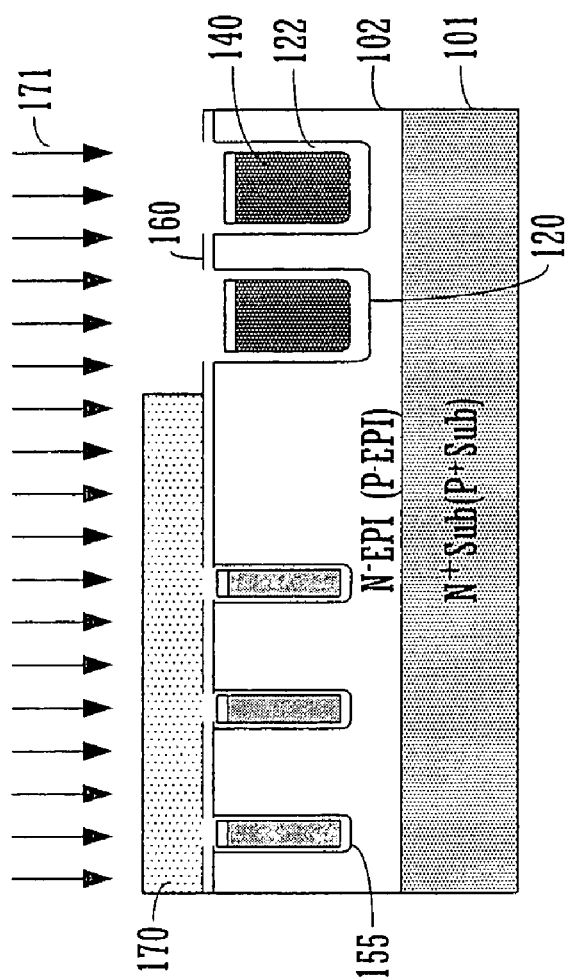
Figure 11:
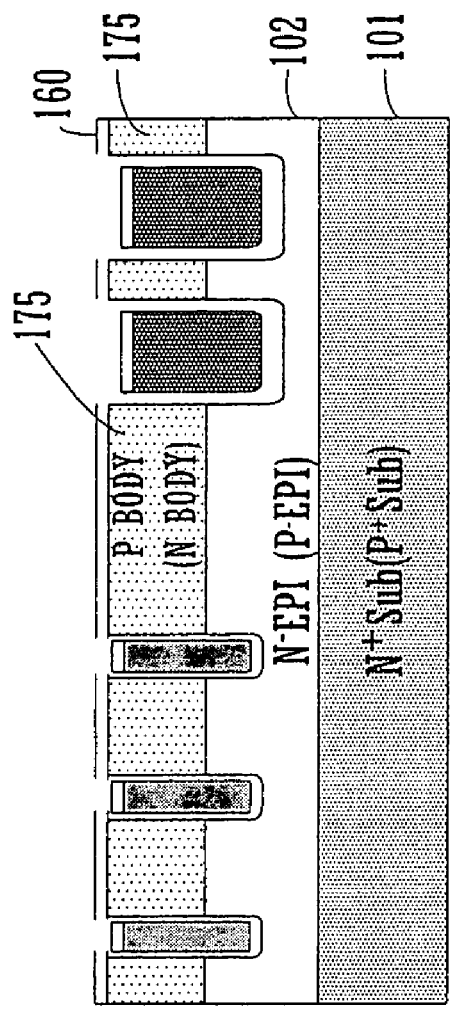

In FIG. 1H, mask 170 is used to protect the MOSFET trenches 155 from an ESD implant 171 to form a P+(N+) type of trench polysilicon diode. The ESD implant can be modified to tune the characteristics of the trench polysilicon diode of the present invention. For example, different implant dose can be used for different breakdown voltages of the diode.

In FIG. 1I, a body implant is performed to form P (N) type body region 175. In one embodiment of the invention, a body block mask is used to form the body implant area. In one embodiment of the invention, the body implant is driven in after implantation.

Figure 1J:
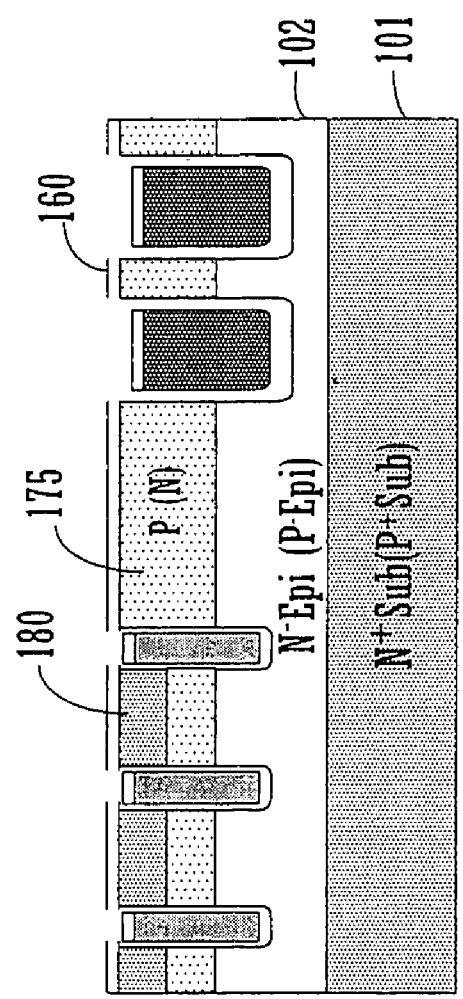

In FIG. 1J, a source block mask is used to form the source implant area and N+(P+) type silicon regions 180 are formed. At the same time the source implant is also used to form a N+(P+) type polysilicon region of trench polysilicon diode. The unblocked polysilicon region 140 of FIG. 1G is now an N+(P+) type doped region.

Figure 1K:
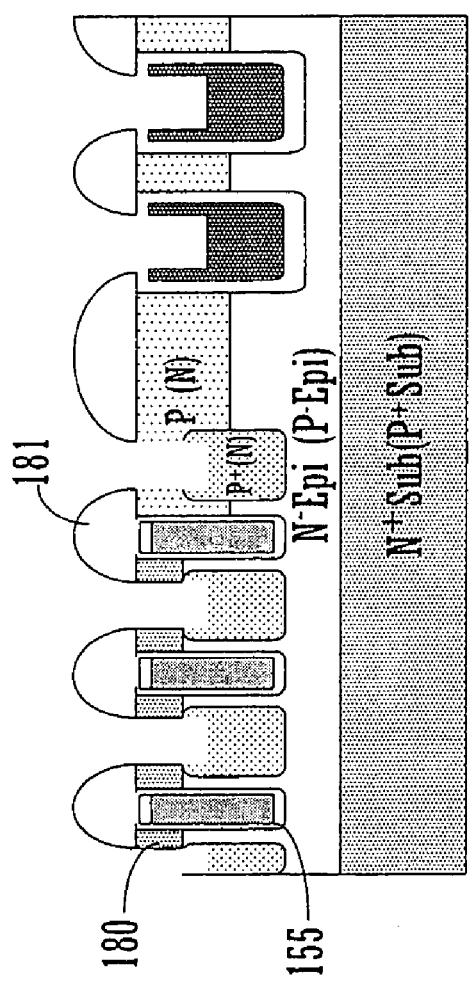
Figure 1L:
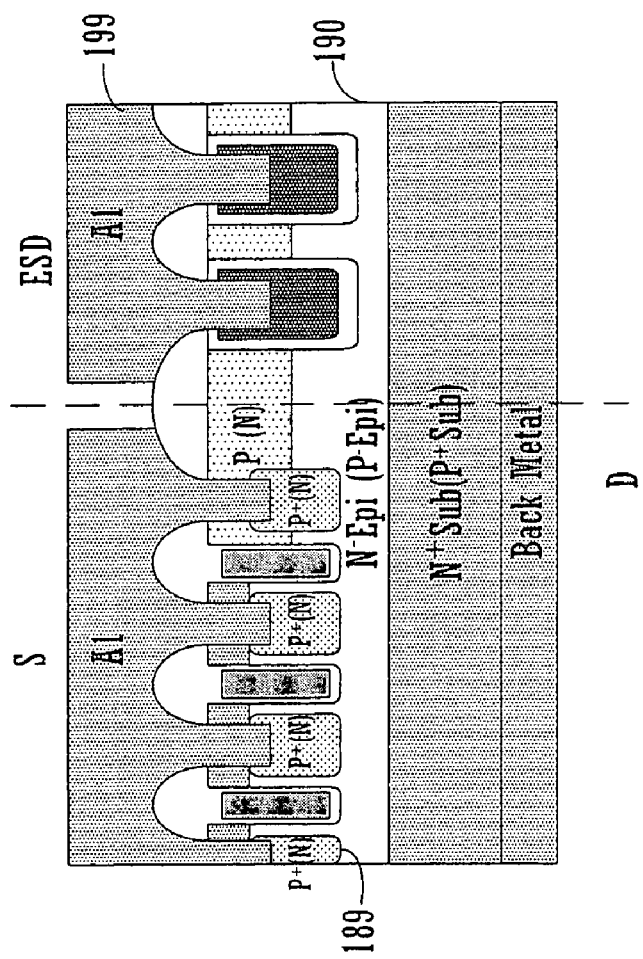

In FIGS. 1K and 1L, the trench transistors 155 are completed in a conventional manner. In FIG. 1K, LTO (low temperature oxide) plus BPSG (borophosphorsilicate glass) layers 181 are formed and the source and gate electrodes are patterned. In one embodiment of the invention, a contact mask is used during a contact implant to form a contact. After contact formation, in one embodiment of the invention, a clamping implant can be performed when a clamping function is desired.

In FIG. 1L, metallization 199 is performed to complete the source/drain side 189 of the MOSFET transistor and the ESD side 190.

Figure 2A:
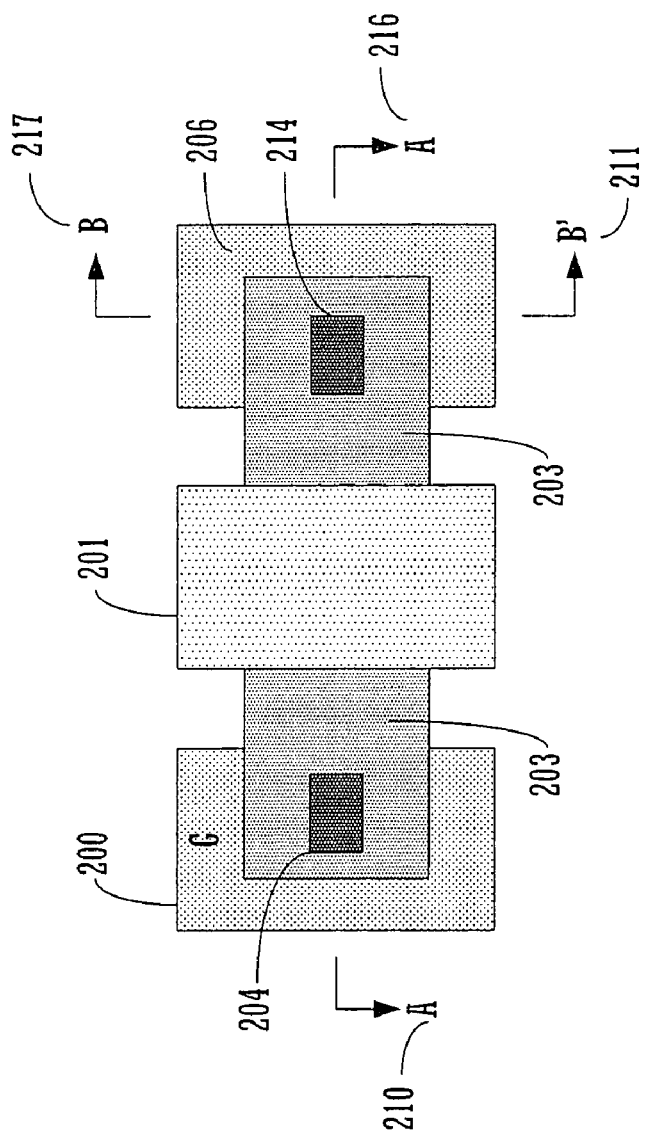
FIG. 2A is an illustration of an exemplary single stripe trench polysilicon Zener diode cell layout in accordance with embodiments of the present invention.

FIG. 2A is an illustration of a single stripe vertical trench polysilicon Zener diode cell layout in accordance with embodiments of the present invention. One Zener diode electrode comprises a metal region 200, an N+(P+) type polysilicon region 203 and a gate contact 204. The ground side 206 also comprises an N+(P+) type polysilicon region 203 and a ground contact 214. A P+(N+) type polysilicon region 201 is between the N+(P+) type polysilicon regions 203.

The NPN (PNP) (e.g., N+(P+) 203, P+(N+) 201, N+(P+) 203) region forms the trench polysilicon Zener diode of the present invention. In one embodiment of the trench polysilicon Zener diode of the present invention is used for ESD protection. In one embodiment of the invention, multiple polysilicon trench Zener diodes can be coupled (e.g., in parallel) to achieve different ESD protection ratings.

In another embodiment of the invention, the trench polysilicon Zener diode of the present invention is used for a clamping function. In another embodiment of the invention, a trench polysilicon diode of the present invention can be used for temperature sensing. A cross section of the trench polysilicon Zener diode of FIG. 2A can be viewed by bisecting the Zener diode along an axis from A 210 to A' 216 (as illustrated in FIG. 2B).

Figure 2B:
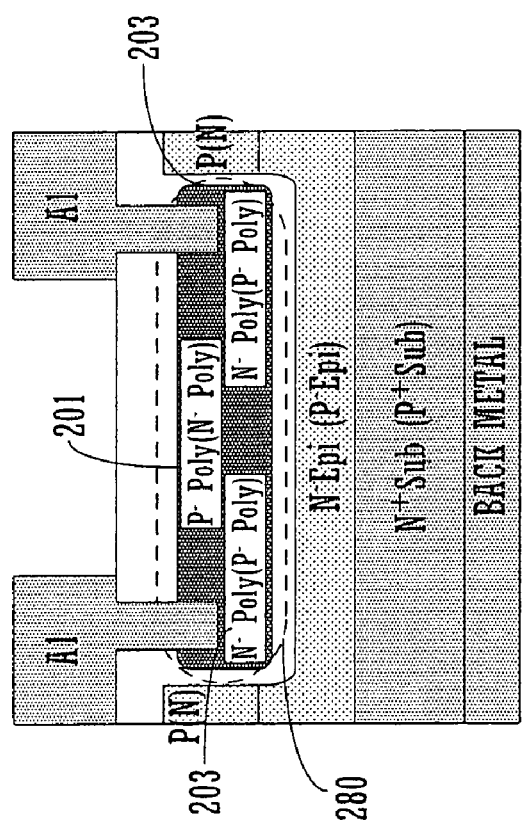
FIG. 2B is an illustration of a first cross section view of a single stripe trench polysilicon Zener diode in accordance with embodiments of the present invention.

FIG. 2B is a first cross section of the vertical trench polysilicon diode of FIG. 2A from A 210 to A' 216 (of FIG. 2A). The NPN (PNP) formation corresponds to the trench polysilicon Zener diode 280 of FIG. 2B.

Figure 2C:
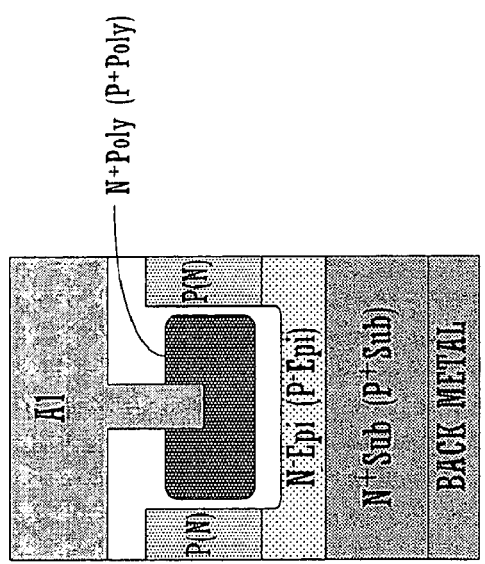
FIG. 2C is an illustration of a second cross section view of a single stripe trench polysilicon Zener diode in accordance with embodiments of the present invention.

FIG. 2C is a second cross section of the vertical trench polysilicon diode of FIG. 2A from B 211 to B' 217 (of FIG. 2A).

Figure 3A:
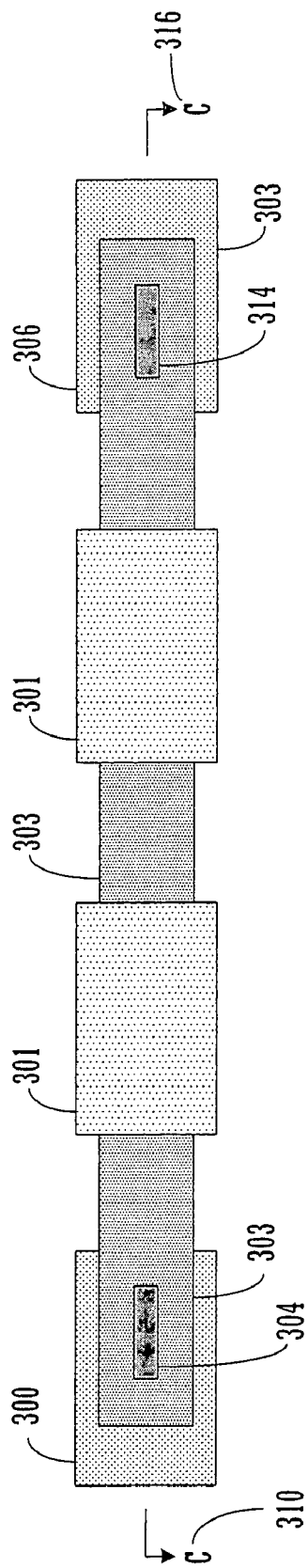
FIG. 3A is an illustration of a double stripe trench polysilicon Zener diode cell layout in accordance with embodiments of the present invention to double the break down voltage of the trench polysilicon Zener diode compared with a single stripe trench polysilicon Zener diode. The higher the breakdown voltage of the trench polysilicon Zener diode, the stripe trench polysilicon Zener diode cell layout can be designed.

FIG. 3A is an illustration of a double stripe vertical trench polysilicon Zener diode cell layout in accordance with embodiments of the present invention. The gate side 300 comprises an N+(P+) type polysilicon region 303 and a gate contact 304. The ground side 306 comprises an N+(P+) type polysilicon region 303 and a ground contact 314. Two P+(N+) type polysilicon regions 301 are between the N+(P+) type polysilicon regions 203. Between the two P+(N+) type polysilicon regions 301 is another N+(P+) type polysilicon region 303. The NPNPN (PNPNP) region forms a plurality of trench polysilicon diodes of the present invention. In one embodiment of the plurality of trench polysilicon diodes of the present invention are coupled and used for ESD protection. A cross section of the trench polysilicon Zener diode of FIG. 3A can be viewed by bisecting the Zener diode along an axis from C 310 to C' 316 (as illustrated in FIG. 3B).

Figure 3B:
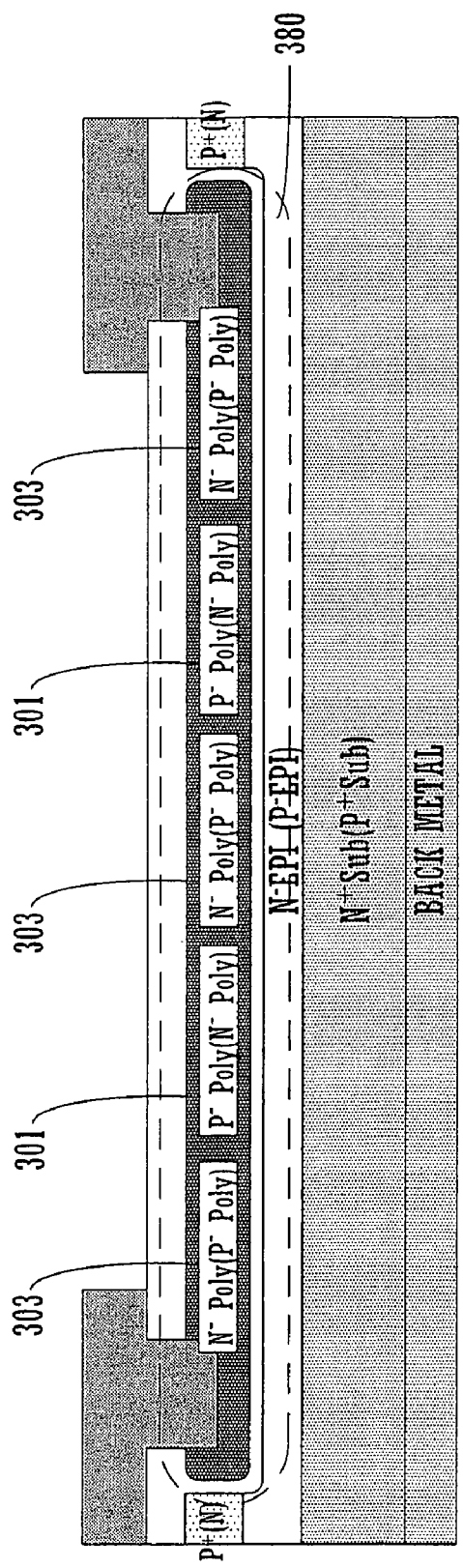
FIG. 3B is an illustration of a cross section view of a double stripe trench polysilicon Zener diode in accordance with embodiments of the present invention.

FIG. 3B is a cross section of the vertical trench polysilicon Zener diode of FIG. 3A from C 310 to C' 316 (of FIG. 3A). The NPNPN (PNPNP) formation corresponds to a plurality of trench polysilicon Zener diodes 380 of FIG. 3B coupled together.

Figures 3C, 3D:
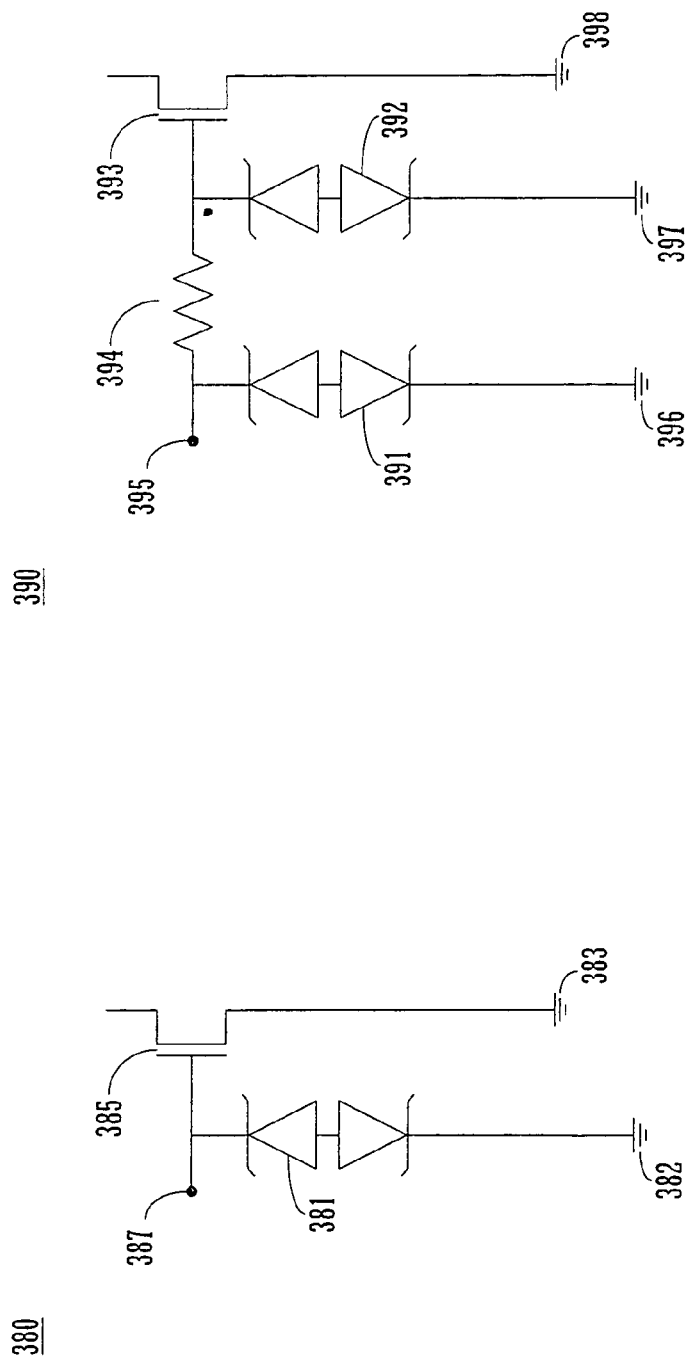
FIG. 3C is a schematic of an exemplary single stage trench polysilicon Zener diode for ESD protection in accordance with embodiments of the present invention.
FIG. 3D is a schematic of an exemplary dual stage polysilicon Zener diode for ESD protection in accordance with embodiments of the present invention.

FIG. 3C is a schematic of a single stage ESD protection circuit 380 comprising a vertical trench polysilicon Zener diode 381 in accordance with embodiments of the present invention.

FIG. 3D is a schematic of a dual stage ESD protection circuit 390 comprising a first vertical trench polysilicon Zener diode 391, a trench polisilicon resistance and a second vertical trench polysilicon Zener diode 392 in accordance with embodiments of the present invention.

FIG. 4 is a flow diagram of an exemplary method for manufacturing a vertical trench polysilicon diode in accordance with embodiments of the present invention. In one embodiment of the invention, the resulting trench polysilicon Zener diode of process 400 is used for ESD protection. In another embodiment of the invention, the resulting trench polysilicon diode of process 400 is used for over-voltage protection and/or a clamping function. It is appreciated that method 400 can also be used for manufacturing a trench polysilicon diode that can be used for temperature sensing.

At step 402, process 400 includes forming a N−(P−) type epitaxial region on a N+(P+) type substrate.

At step 404, process 400 includes forming a trench in the N−(P−) type epitaxial region and growing LOCOS oxide on it. In one embodiment of the invention, the trench formed in step 404 is an ESD trench. In one embodiment of the invention, the thickness of the LOCOS oxide can be modified to support a desired breakdown voltage for the finished diode.

At step 406, process 400 includes depositing a polysilicon, etching back the polysilicon, and using the remaining polysilicon to fill a top surface of the trench formed in step 404.

At step 408, process 400 includes forming a P+(N+) type polysilicon region in the trench polysilicon formed in step 406 by doing P+(N+) type ESD implanting. In one embodiment of the invention, the P+(N+) type ESD implanting dose can be modified to achieve a desired breakdown voltage and ESD rating for the finished diode.

At step 410, process 400 includes forming a N+(P+) type polysilicon region in the trench polysilicon formed in step 406 by doing N+(P+) type source implanting.

At step 412, process 400 includes forming a diode in the body region wherein a portion of the diode is lower than the top surface of the trench. In one embodiment of the invention, performing a sequence of implants forms the diode. A first ESD implant is performed to dope the polysilicon deposited in the trench (forming a P+(N+) type polysilicon region) and a second source implant is performed to dope the polysilicon deposited in the trench (forming an N+(P+) type polysilicon region). In one embodiment of the invention, the resulting N+(P+) type doned polysilicon deposited in the trench is used as a resistor.

Figure 5A:
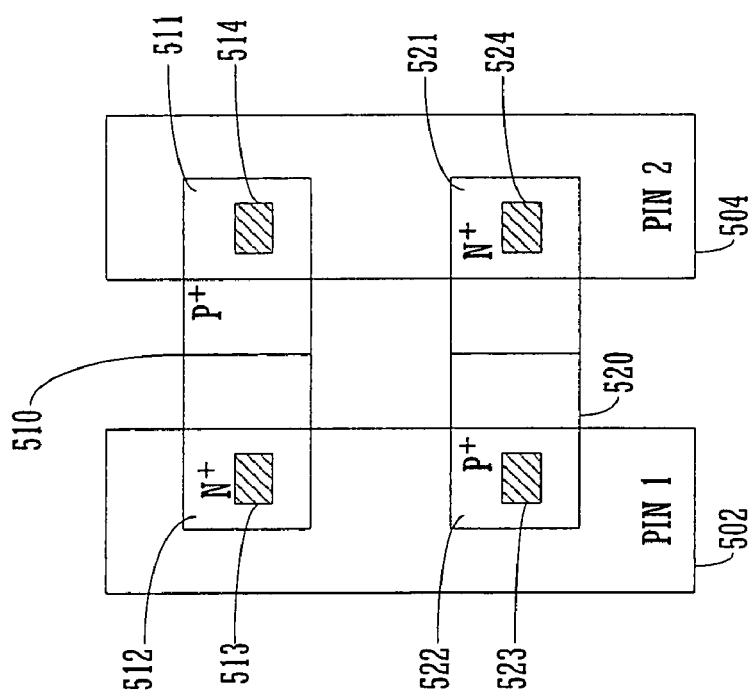
FIG. 5A is an illustration of a top layout view of an exemplary temperature sensing circuit comprising vertical trench diodes in accordance with embodiments of the present invention.

FIG. 5A is a schematic top layout view 500a for sensing temperature in accordance with embodiments of the present invention. The temperature sensor 500a comprises vertical trench polysilicon diodes 510 and 520. The trench polysilicon diodes 510 and 520 are electrically coupled in anti-parallel and are electrically coupled to pins one 502 and two 504.

Trench diode 510 comprises a region of N+ type polysilicon region 512 and a region of P+ type polysilicon region 511. Diode 510 is electrically coupled to pin one 502 via contact 513 and is electrically coupled to pin two 504 via contact 514.

Trench diode 520 comprises a region of N+ type polysilicon region 521 and a region of P+ type polysilicon region 522. Diode 520 is electrically coupled to pin one 502 via contact 523 and is electrically coupled to pin two 504 via contact 524.

A temperature can be determined by measuring a voltage between pin one 502 and pin two 504. A look-up table can be used to determine corresponding temperatures for a plurality of voltages.

Figure 5B:
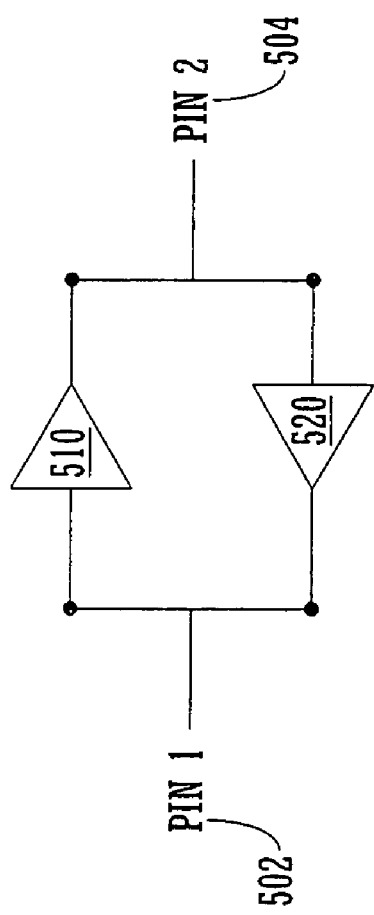
FIG. 5B is a schematic of a temperature sensing circuit comprising vertical trench polysilicon diodes in accordance with embodiments of the present invention.

FIG. 5B is an illustration of an exemplary circuit 500b of FIG. 5A. Trench polysilicoin diodes 510 and 520 are electrically coupled to pins one 502 and two 504. A voltage can be measured between pin one 502 and pin two 504 and a corresponding temperature can be determined by a look-up table, for example. It is appreciated that any number of methods of retrieving a corresponding temperature for a given voltage can be used in accordance with embodiments of the invention.

Embodiments of the present invention, a vertical trench polysilicon diode have been described. While the present invention has been described in particular embodiments, it should be appreciated that the present invention should not be construed as limited by such embodiments, but rather construed according to the following Claims.

What is claimed is:

1. A method of manufacturing a semiconductor device comprising:
   forming a N–(P–) type epitaxial region on N+(P+) type substrate;
   forming a polysilicon diode trench in said epitaxial region;
   forming an insulating layer in said polysilicon diode trench;
   filling said polysilicon diode trench with polysilicon;
   implanting a P+(N+) type dopant, forming a P+(N+) type region of said polysilicon in said polysilicon diode trench;
   implanting a N+(P+) type dopant, forming a N+(P+) type region of said polysilicon in said polysilicon diode trench to form a polysilicon diode in said polysilicon diode trench, wherein a portion of said polysilicon diode is lower than said top surface of said polysilicon diode trench; and
   forming a metal-oxide-semiconductor field effect transistor (MOSFET) transistor trench in said epitaxial region,
   wherein, forming said diode is performed prior to forming said MOSFET transistor trench.

2. The method as described in claim 1 wherein said insulating layer comprises an oxide.

3. The method as described in claim 1 wherein said insulating layer has a breakdown voltage rating greater than a drain-source breakdown voltage of said MOSFET trench transistor.

4. The method as described in claim 1 wherein said insulating layer is a few thousand angstroms in thickness and said insulating layer thickness in said trench depends on its breakdown voltage requirement.

5. The method as described in claim 1 wherein said polysilicon diode is a Zener diode.

6. The method as described in claim 5 wherein said Zener diode is used for electrostatic discharge protection.

7. The method as described in claim 5 wherein said Zener diode is used for a clamping function.

8. The method as described in claim 1 wherein said polysilicon diode is used for temperature sensing.

9. The method as described in claim 1 wherein said N+(P+) type doped polysilicon in said trench is used as a resistor.

10. A method of manufacturing a trench polysilicon diode comprising:
    forming a trench in a N–(P–) type epitaxial region on a N+(P+) type substrate;
    forming an insulating layer in said trench wherein said insulating layer lines said trench;
    filling said trench with a polysilicon forming a top surface of said trench;
    forming a diode in said body region wherein a portion of said diode is lower than said top surface of said trench; and
    forming a MOSFET transistor trench on said epitaxial region,
    wherein forming said diode is performed prior to forming said MOSFET transistor trench.

11. The method as described in claim 10 further comprising: forming a plurality of Zener diodes in said N–(P–) type epitaxial region and coupling said plurality of Zener diodes in parallel to protect said transistor from electrostatic discharge.

12. The method as described in claim 10 wherein said insulating layer comprises an oxide.

13. The method as described in claim 10 wherein said insulating layer in said trench has a breakdown voltage rating greater than a drain-source breakdown voltage of said MOSFET trench transistor.

14. The method as described in claim 10 wherein said insulating layer is of a few thousand angstroms in thickness and said insulating layer thickness in said trench depends on its breakdown voltage requirement.

15. The method as described in claim 10 wherein formation of said diode occurs prior to the formation of a MOSFET trench of said transistor.

16. The method as described in claim 10 wherein said diode is a Zener diode.

17. The method as described in claim 16 wherein said Zener diode is used for electrostatic discharge protection.

18. The method as described in claim 16 wherein said Zener diode is used for a clamping function.

19. The method as described in claim 10 wherein said diode is a trench diode and is used for temperature sensing.

20. The method as described in claim 10 wherein said N+(P+) type doped polysilicon in said trench is used as a resistor.

* * * * *